(12) United States Patent
Liu et al.

(10) Patent No.: US 11,558,941 B2
(45) Date of Patent: Jan. 17, 2023

(54) ILLUMINATION CONTROL DEVICE AND RELATED ILLUMINATION CONTROL SYSTEM

(71) Applicant: XIAMEN ECO LIGHTING CO. LTD., Xiamen (CN)

(72) Inventors: Yang Liu, Xiamen (CN); Jianxin Xie, Xiamen (CN); Liping Lin, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 0 days.

(21) Appl. No.: 16/821,770

(22) Filed: Mar. 17, 2020

(65) Prior Publication Data

US 2021/0298147 A1 Sep. 23, 2021

(51) Int. Cl.
*H05B 45/375* (2020.01)
*H04L 12/28* (2006.01)
*H04L 12/40* (2006.01)
*H01L 29/866* (2006.01)

(52) U.S. Cl.
CPC ......... *H05B 45/375* (2020.01); *H01L 29/866* (2013.01); *H04L 12/2881* (2013.01); *H04L 12/40045* (2013.01)

(58) Field of Classification Search
CPC .... H05B 45/375; H05B 45/30; H05B 47/185; H01L 29/866; H04L 12/2881; H04L 12/40045
See application file for complete search history.

(56) References Cited

U.S. PATENT DOCUMENTS

| | | | | | |
|---|---|---|---|---|---|
| 8,558,413 | B1* | 10/2013 | Lepard | ............... | H05B 47/18 307/157 |
| 9,295,142 | B1* | 3/2016 | Leinen | ............... | H05B 47/18 |
| 10,873,264 | B2* | 12/2020 | Dotson | ............... | H04L 12/10 |
| 2007/0061598 | A1* | 3/2007 | Bitton | ............ | G11B 33/1406 713/194 |
| 2010/0237695 | A1* | 9/2010 | Covaro | ........... | H02J 13/0096 307/19 |
| 2012/0271477 | A1* | 10/2012 | Okubo | ............... | H04L 12/10 700/297 |
| 2017/0127493 | A1* | 5/2017 | Woytowitz | .......... | H05B 45/28 |
| 2018/0098201 | A1* | 4/2018 | Torello | ............. | H04W 4/023 |
| 2018/0139823 | A1* | 5/2018 | Hick | ................ | H05B 47/11 |
| 2018/0249556 | A1* | 8/2018 | Wendt | ............... | H05B 47/18 |
| 2020/0371572 | A1* | 11/2020 | Plank | ............. | H04L 12/40045 |

* cited by examiner

*Primary Examiner* — Borna Alaeddini
(74) *Attorney, Agent, or Firm* — Chun-Ming Shih; Lanway IPR Services (57) ABSTRACT

A control device for controlling at least one LED module includes: a power supply module arranged to receive power over Ethernet to generate a first supply power; and an illumination controlling module coupled to the power supply module for receiving a communication signal from the Ethernet to generate a serial bus signal to control an illumination of the at least one LED module; wherein the illumination controlling module is powered by the first supply power.

8 Claims, 8 Drawing Sheets

ILLUMINATION CONTROL DEVICE AND RELATED ILLUMINATION CONTROL SYSTEM

FIELD

The present invention relates to the field of illumination, and more particularly to a wire-communicated illumination control device, and the related system.

BACKGROUND

Conventionally, in the field of lighting system, the operation of an illumination control device is either controlled by wireless communication method or wired communication method. For example, the wireless communication method may be the technique of WIFI (Wireless Fidelity), BLE (Bluetooth Low Energy, or Zigbee. The wired communication method may be the technique of DALI (Digital Addressable Lighting Interface), 0-10V, or DMX512. However, when an illumination control device is controlled by the above mentioned communication methods, a power adaptor may be used to externally couple to the illumination control device for providing the suitable supply power. The complex connection between the power adaptor and the illumination control device may increase the design complexity and the cost of the illumination control device. Therefore, there is a need to provide a novel illumination control device with relatively low complexity to solve the above problems.

SUMMARY

Embodiments of the present invention provide a control device for controlling at least one LED module. The control device comprises: a power supply module, arranged to receive power over Ethernet to generate a first supply power; and an illumination controlling module, coupled to the power supply module, for receiving a communication signal from the Ethernet to generate a serial bus signal to control an illumination of the at least one LED module; wherein the illumination controlling module is powered by the first supply power.

In one embodiment of the control device, the illumination controlling module comprises: an Ethernet controlling module, arranged to generate a first serial signal according to the Ethernet communication signal; and a serial communication module, coupled to the Ethernet controlling module, for generating the serial bus signal according to the first serial signal; wherein the first supply power comprises a second supply power and a third supply power, and the Ethernet controlling module and the serial communication module are powered by the second supply power and the third supply power respectively.

In one embodiment of the control device, the power supply module comprises: a power converting module, arranged to convert the Ethernet power into a current; and a buck converter, coupled to the power converting module, the Ethernet controlling module, and the serial communication module, for generating the second supply power and the third supply power according to the current.

In one embodiment of the control device, the Ethernet controlling module comprises: an Ethernet signal receiving module, arranged to generate a second serial signal according to the Ethernet communication signal; and a control module, coupled to the Ethernet signal receiving module, for generating the first serial signal according to the second serial signal.

In one embodiment of the control device, the control module comprises: a microprocessor, having a set of output terminals for outputting the first serial signal; wherein the set of output terminals comprises three general purpose input/output terminals (GPIO) of the microprocessor.

In one embodiment of the control device, the second supply power comprises a fourth supply power and a fifth supply power. The control module further comprises: an analog supply power terminal for receiving the fifth supply power; a first diode, having a cathode coupled to a supply power terminal of a battery of the microprocessor, and an anode coupled to the fourth supply power; a first button, having a first terminal coupled to a reset terminal of the microprocessor, and a second terminal coupled to a power ground; a first capacitor, having a first terminal coupled to the reset terminal of the microprocessor, and a second terminal coupled to the power ground; and a first resistor, having a first terminal coupled to the fifth supply power and a supply power terminal of the microprocessor, and a second terminal coupled to the reset terminal of the microprocessor.

In one embodiment of the control device, the microprocessor further comprises a first data input/output terminal, a master out slave in (MOSI) terminal, a master in slave out (MISO) terminal, a synchronous clock terminal, a chip select (CS) terminal, and a second data input/output terminal for receiving the second serial signal.

In one embodiment of the control device, the Ethernet signal receiving module comprises: an Ethernet controller, having an interrupt signal output terminal, a master in slave out terminal, a master out slave in terminal, a synchronous clock terminal, a chip select terminal, a reset terminal, a bias current terminal, and an external resistor terminal; a second capacitor, having a first terminal coupled to the external resistor terminal, and a second terminal coupled to the power ground; a second resistor, having a first terminal coupled to the interrupt signal output terminal, and a second terminal coupled to the first data input/output terminal of the microprocessor; a third resistor, having a first terminal coupled to the master in slave out terminal of the Ethernet controller, and a second terminal coupled to the master in slave out terminal of the microprocessor; a fourth resistor, having a first terminal coupled to the master out slave in terminal of the Ethernet controller, and a second terminal coupled to the master out slave in terminal of the microprocessor; a fifth resistor, having a first terminal coupled to the synchronous clock terminal of the Ethernet controller, and a second terminal coupled to the synchronous clock terminal of the microprocessor; a sixth resistor, having a first terminal coupled to the chip select terminal of the Ethernet controller, and a second terminal coupled to the chip select terminal of the microprocessor; a seventh resistor, having a first terminal coupled to the reset terminal of the Ethernet controller, and a second terminal coupled to the second data input/output terminal of the microprocessor; and an eighth resistor, having a first terminal coupled to the bias current terminal of the Ethernet controller, and a second terminal coupled to the power ground.

In one embodiment of the control device, the second supply power further comprises a sixth supply power. The Ethernet controller further comprises a supply power terminal, a phase-locked loop supply power terminal, a supply power receiving terminal, and a supply power transmitting terminal, and the supply power terminal, the phase-locked loop supply power terminal, the supply power receiving terminal, and the supply power transmitting terminal are coupled to the sixth supply power.

In one embodiment of the control device, the Ethernet controller further comprises a first LED driving terminal, a second LED driving terminal, a negative terminal of a pair of differential input terminals, a positive terminal of the pair of differential input terminals, a negative terminal of a pair of differential output terminals, and a positive terminal of the pair of differential output terminals, for receiving the Ethernet communication signal.

In one embodiment of the control device, the serial communication module comprises: a transceiver, having a receiving output terminal, a receiving enable terminal, a driving enable terminal, and a driving input terminal; a ninth resistor, having a first terminal coupled to the receiving output terminal; a tenth resistor, having a first terminal coupled to the receiving enable terminal and the driving enable terminal; an eleventh resistor, having a first terminal coupled to the driving input terminal; wherein a second terminal of the ninth resistor, a second terminal of the tenth resistor, and a second terminal of the eleventh resistor are arranged to receive the first serial signal.

In one embodiment of the control device, the transceiver further comprises a supply power terminal, a positive driving output terminal, a negative driving output terminal, and a ground terminal. The serial communication module further comprises: a second capacitor, having a first terminal coupled to the supply power terminal of the transceiver and the third supply power, and a second terminal coupled to the power ground; a twelfth resistor, having a first terminal coupled to the supply power terminal of the transceiver, and a second terminal coupled to the positive driving output terminal of the transceiver; a thirteenth resistor, having a first terminal coupled to the second terminal of the twelfth resistor; a fourteenth resistor, having a first terminal coupled to the ground terminal of the transceiver, and a second terminal coupled to the negative driving output terminal of the transceiver; a fifteenth resistor, having a first terminal coupled to the second terminal of the fourteenth resistor; a sixteenth resistor, having a first terminal coupled to a second terminal of the thirteenth resistor, and a second terminal coupled to a second terminal of the fifteenth resistor; a first Zener diode, having a cathode coupled to the second terminal of the twelfth resistor, and an anode coupled to the power ground; a second Zener diode, having a cathode coupled to the second terminal of the fourteenth resistor, and an anode coupled to the power ground; and a third Zener diode, having a cathode coupled to the second terminal of the twelfth resistor, and an anode coupled to the second terminal of the fourteenth resistor; wherein the second terminal of the thirteenth resistor, the second terminal of the fifteenth resistor, the first terminal and the second terminal of the sixteenth resistor are configured to be a plurality of output terminals for outputting the serial bus signal of the serial communication module.

Embodiments of the present invention provide a wire-communicated illumination control device for controlling a plurality of light emitting diode (LED) modules. The wire-communicated illumination control device comprises: a power supply module, coupled to an Ethernet, for generating a plurality of supply powers according to an Ethernet power; an Ethernet controlling module, coupled to the power supply module and the Ethernet, and being powered by a first supply power in the plurality of supply powers for generating a first serial signal according to an Ethernet communication signal; and a serial communication module, coupled to the Ethernet controlling module and the plurality of LED modules, and being powered by a second supply power in the plurality of supply powers for generating a serial bus signal to control the illumination of the plurality of LED modules according to the first serial signal.

In one embodiment of the wire-communicated illumination control device, the power supply module comprises: an Ethernet power converting module, arranged to generate a DC (Direct-current) current according to the Ethernet power; and a buck converter, coupled to the Ethernet power converting module, for generating the plurality of supply powers according to the DC current.

In one embodiment of the wire-communicated illumination control device, the Ethernet controlling module comprises: an Ethernet signal receiving module, arranged to generate a second serial signal according to the Ethernet communication signal; and a control module, coupled to the Ethernet signal receiving module, for generating the first serial signal according to the second serial signal.

In one embodiment of the wire-communicated illumination control device, the Ethernet signal receiving module comprises: an Ethernet controller, for receiving the Ethernet communication signal over the Ethernet to generate the second serial signal.

Embodiments of the present invention provide an illumination control system. The illumination control system comprises: a user controlled terminal device, for generating an original Ethernet communication signal according to a user inputted signal; a router, coupled to the user controlled terminal device, for generating an Ethernet communication signal according to the original Ethernet communication signal; an active Ethernet switch, coupled to the router, for outputting an Ethernet power; a wire-communicated illumination control device, coupled to the active Ethernet switch and powered by the Ethernet power; and a plurality of LED modules, coupled to the wire-communicated illumination control device, for being controlled by the wire-communicated illumination control device according to the Ethernet communication signal; wherein the active Ethernet switch is further arranged to forward the Ethernet communication signal to the wire-communicated illumination control device.

In one embodiment of the illumination control system, the wire-communicated illumination control device comprises: a power supply module, coupled to the active Ethernet switch, for generating a plurality of supply powers according to the Ethernet power; an Ethernet controlling module, coupled to the power supply module and the active Ethernet switch, and being powered by a first supply power in the plurality of supply powers for generating a first serial signal according to an Ethernet communication signal; and a serial communication module, coupled to the Ethernet controlling module and the plurality of LED modules, and being powered by a second supply power in the plurality of supply powers for generating a serial bus signal to control the illumination of the plurality of LED modules according to the first serial signal.

In one embodiment of the illumination control system, the illumination control system further comprises: a server, coupled to the user controlled terminal device and the router, for generating the Ethernet communication signal to the router according to the original Ethernet communication signal.

In one embodiment of the illumination control system, each of the plurality of LED modules comprises: a driving module, arranged to generate a driving signal according to a serial bus signal; and an LED module, coupled to the driving module, for being illuminated according to the driving signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Figure 1:
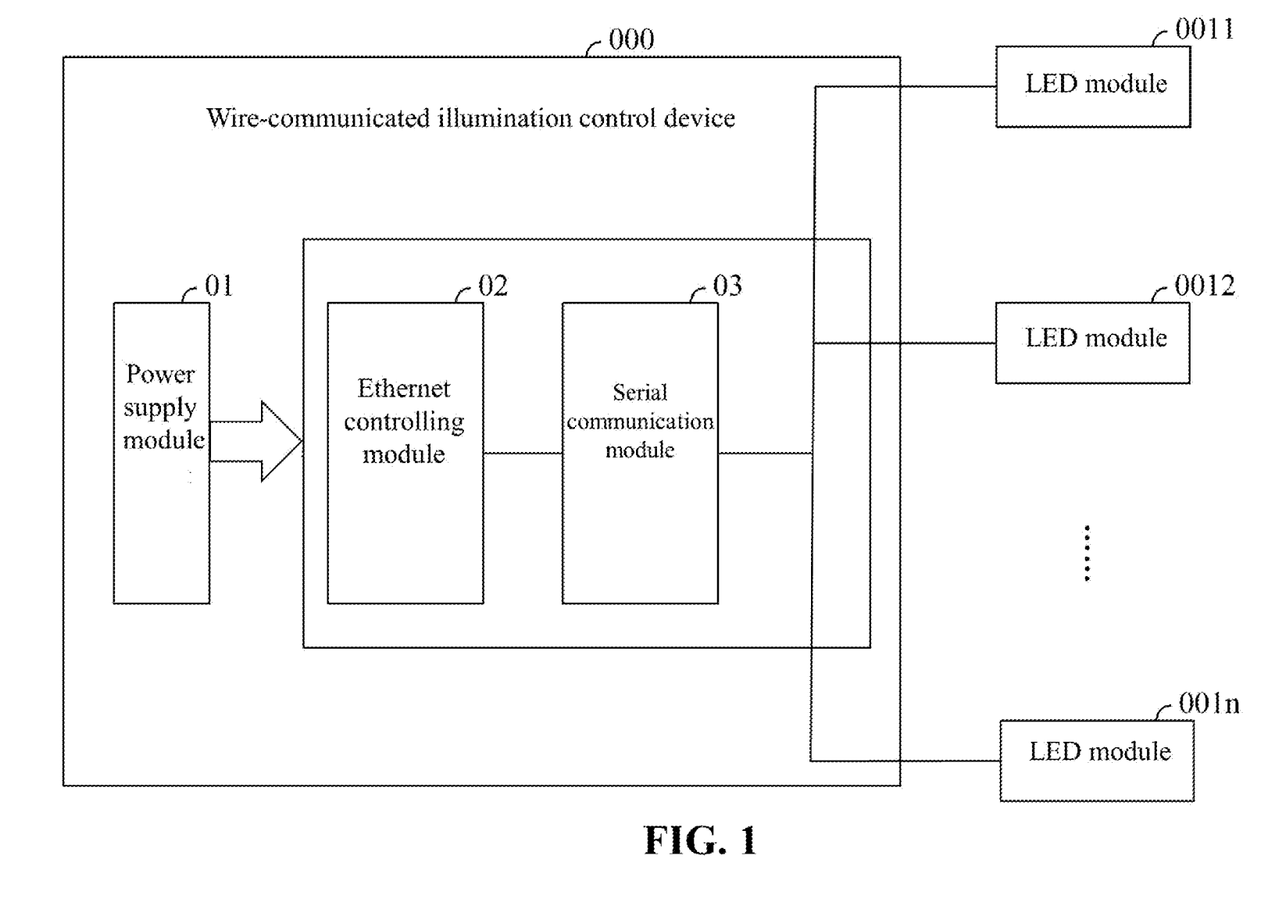
FIG. 1 is a diagram illustrating a displaying apparatus according to an embodiment of the present invention.

FIG. 1 is a diagram illustrating a displaying apparatus according to an embodiment of the present invention. The operation of the displaying apparatus is controlled by a control device, which may be a wire-communicated illumination control device. The wire-communicated illumination control device may be arranged to control the illumination of a plurality of displaying modules. For brevity, FIG. 1 merely shows the portions that are related to the present invention. In practice, other devices may also be included in the displaying apparatus. The structure and operation of the wire-communicated illumination control device is described in the following paragraphs.

The displaying apparatus comprises a wire-communicated illumination control device 000 and a plurality of light emitting diode (LED) modules 001$i$ (i.e. 0011-001$n$). According to the present embodiment, the wire-communicated illumination control device 000 is coupled to the plurality of LED modules 001$i$. The wire-communicated illumination control device 000 comprises a power supply module 01, an Ethernet controlling module 02, and a serial communication module 03. The Ethernet controlling module 02 is coupled to the power supply module 01. The serial communication module 03 is coupled to the Ethernet controlling module 02. The plurality of LED modules 001$i$ are coupled to the serial communication module 03. The Ethernet controlling module 02 and the serial communication module 03 may be regarded as an illumination controlling module, which receives a communication signal from the Ethernet to generate a serial bus signal to control an illumination of the at least one of the plurality of LED modules 001$i$.

According to the present embodiment, the power supply module 01 is coupled to Ethernet. The power supply module 01 is arranged to supply powers to a plurality of functional modules (e.g. the Ethernet controlling module 02 and the serial communication module 03) in the display module according to an Ethernet power. The Ethernet power is the power over Ethernet (PoE). Therefore, the Ethernet power may be the electric power transmitted along with data on twisted pair Ethernet cabling. In this embodiment, the power supply module 01 is arranged to provide powers for the Ethernet controlling module 02, and the serial communication module 03.

In addition, the Ethernet controlling module 02 is arranged to generate a first serial signal according to an Ethernet communication signal. The Ethernet controlling module 02 may receive the Ethernet communication signal from the Ethernet. It is noted that the first serial signal may comprises a plurality of synchronized serial signals.

Figure 3:
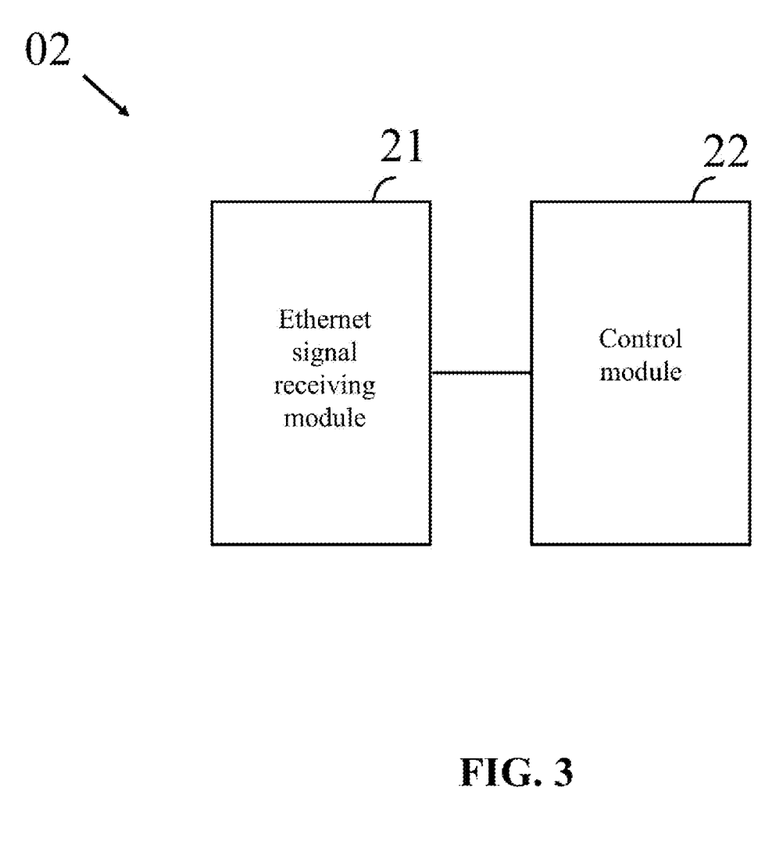
FIG. 3 is a diagram illustrating an Ethernet controlling module of a wire-communicated illumination control device according to an embodiment of the present invention.

The serial communication module 03 is coupled to a control module (e.g. the control module 022 as shown in FIG. 3) for generating a serial bus signal according to the first serial signal. The plurality of LED modules 001$i$ are coupled to the serial communication module 03, and the plurality of LED modules 001$i$ are lighted up according to the serial bus signal. More specifically, the illumination of the plurality of LED modules 001i may be controlled by the serial bus signal.

According to the present embodiment, the Ethernet communication signal may be arranged to carry the illumination controlling commands for the plurality of LED modules 001i. For example, the serial bus signal may be the RS485 communication signals.

Figure 2:
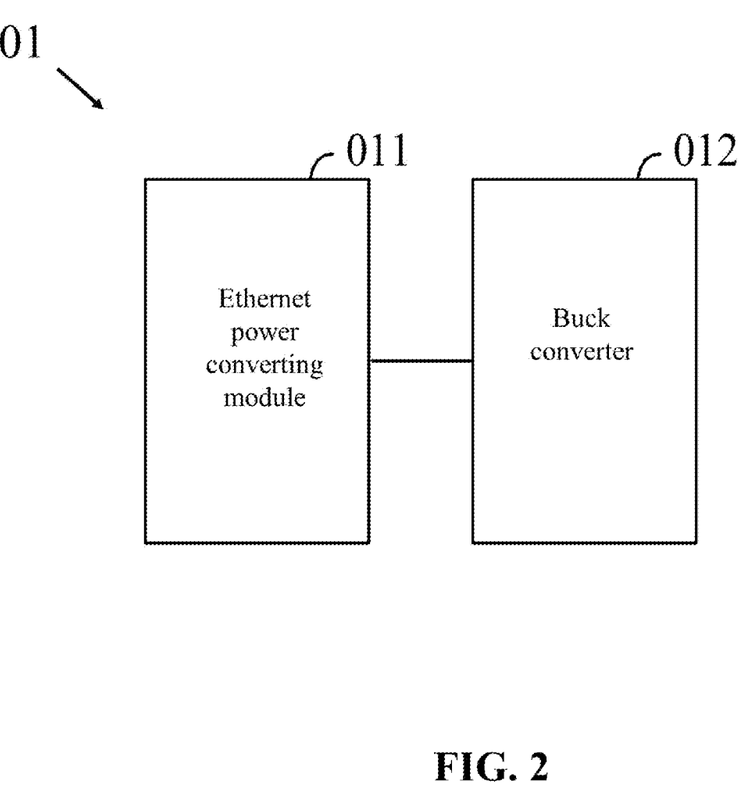
FIG. 2 is a diagram illustrating a power supply module of a wire-communicated illumination control device according to an embodiment of the present invention.

FIG. 2 is a diagram illustrating the power supply module 01 of the wire-communicated illumination control device 000 according to an embodiment of the present invention. As shown in FIG. 2, the power supply module 01 comprises an Ethernet power converting module 011 and a buck converter 012. The buck converter 012 is coupled to the Ethernet power converting module 011.

According to the present embodiment, the Ethernet power converting module 011 may be coupled to the Ethernet for receiving the Ethernet power. The Ethernet power converting module 011 is arranged to generate a DC (Direct-current) current according to the Ethernet power. The buck converter 012 is coupled to the Ethernet power converting module 011 for generating supply power according to the DC current.

The supply power may comprise a plurality of different or the same supply powers. According to the present embodiment, the supply power comprises four supply powers, i.e. a first supply power VAA, a second supply power VBB, a third supply power VCC, and a fourth supply power VDD.

FIG. 3 is a diagram illustrating the Ethernet controlling module 02 of the wire-communicated illumination control device 000 according to an embodiment of the present invention. As shown in FIG. 3, the Ethernet controlling module 02 comprises an Ethernet signal receiving module 021 and a control module 022. The control module 022 is coupled to the Ethernet signal receiving module 021. The first supply power VAA and the second supply power VBB are arranged to provide the control module 022. The third supply power VCC is arranged to provide the Ethernet signal receiving module 021. The fourth supply power VDD is arranged to provide the serial communication module 03.

The Ethernet signal receiving module 021 may be coupled to the Ethernet for receiving the Ethernet communication signal. The Ethernet signal receiving module 021 is arranged to generate a second serial signal according to the Ethernet communication signal. The control module 022 is coupled to the Ethernet signal receiving module 021 for generating the first serial signal according to the second serial signal. It is noted that the second serial signal may comprises a plurality of synchronized serial signals.

According to the present embodiment, the second serial signal may the Serial Peripheral Interface (SPI) communication signal, the Medium Independent Interface (MII) communication signal, or the Reduced Medium Independent Interface (RMII) communication signal.

Figure 4:
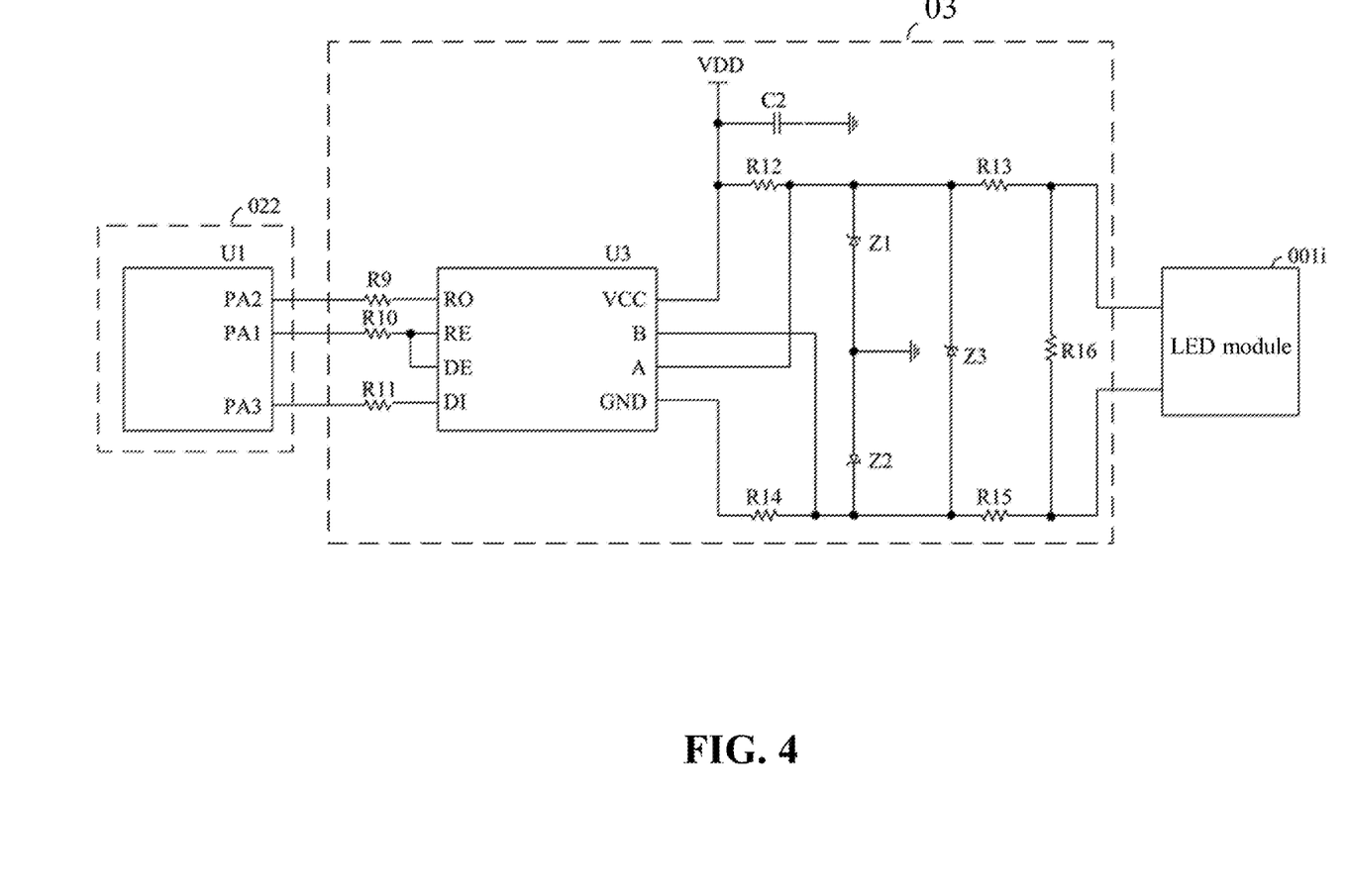
FIG. 4 is a diagram illustrating a control module and a serial communication module of a wire-communicated illumination control device according to an embodiment of the present invention.

FIG. 4 is a diagram illustrating the control module 022 and the serial communication module 03 of the wire-communicated illumination control device 000 according to an embodiment of the present invention. The control module 022 comprises a microprocessor U1. The microprocessor U1 comprises a set of output terminals (e.g. PA1, PA2, and PA3 as shown in FIG. 4) for outputting the first serial signal and a set of input terminals for receiving the second serial signal.

As shown in FIG. 4, the serial communication module 03 is coupled to the control module 022 that generates the first serial signal. The control module 022 may comprise three output terminals for outputting the first serial signal. The three output terminals may be the three general purpose input/output terminals (GPIO) of the microprocessor U1. The microprocessor U1 may be a component of the control module 022. According to the present embodiment, the third data input/output terminal PA2 of the microprocessor U1, the fourth data input/output terminal PA1 of the microprocessor U1, and the fifth data input/output terminal PA3 of the microprocessor U1 are configured to be the output terminals for outputting the first serial signal of the control module 022. For brevity, merely the third data input/output terminal PA2, the fourth data input/output terminal PA1, and the fifth data input/output terminal PA3 of the microprocessor U1 are shown in FIG. 4.

In addition, as shown in FIG. 4, the serial communication module 03 comprises a transceiver (e.g. a RS485 transceiver U3), a first Zener diode Z1, a second Zener diode Z2, a third Zener diode Z3, a second capacitor C2, a ninth resistor R9, a tenth resistor R10, an eleventh resistor R11, a twelfth resistor R12, a thirteenth resistor R13, a fourteenth resistor R14, a fifteenth resistor R15, and a sixteenth resistor R16.

The receiving output terminal RO of the RS485 transceiver U3 is coupled to the first terminal of the ninth resistor R9. The receiving enable terminal RE of the RS485 transceiver U3 is coupled to the driving enable terminal DE of the RS485 transceiver U3 and the first terminal of the tenth resistor R10. The driving input terminal DI of the RS485 transceiver U3 is coupled to the first terminal of the eleventh resistor R11. The second terminal of the ninth resistor R9, the second terminal of the tenth resistor R10, and the second terminal of the eleventh resistor R11 are configured to be the input terminals of the serial communication module 03 for receiving the first serial signal.

The supply power terminal VCC of the RS485 transceiver U3 is coupled to the first terminal of the twelfth resistor R12, the fourth supply power VDD, and the second capacitor C2. The positive driving output terminal A of the RS485 transceiver U3 is coupled to the second terminal of the twelfth resistor R12, the cathode of the first Zener diode Z1, the cathode of the third Zener diode Z3, and the first terminal of the thirteenth resistor R13. The ground terminal GND of the RS485 transceiver U3 is coupled to the first terminal of the fourteenth resistor R14. The negative driving output terminal B of the RS485 transceiver U3 is coupled to the second terminal of the fourteenth resistor R14, the cathode of the second Zener diode Z2, the anode of the third Zener diode Z3, and the first terminal of the fifteenth resistor R15. The second terminal of the thirteenth resistor R13, the second terminal of the fifteenth resistor R15, and the first terminal of the sixteenth resistor R16, and the second terminal of the sixteenth resistor R16 are configured to be the output terminal of the serial bus signal of the serial communication module 03. The anode of the first Zener diode Z1, the anode of the second Zener diode Z2, and the second terminal of the second capacitor C2 are coupled to the power ground.

Figure 5:
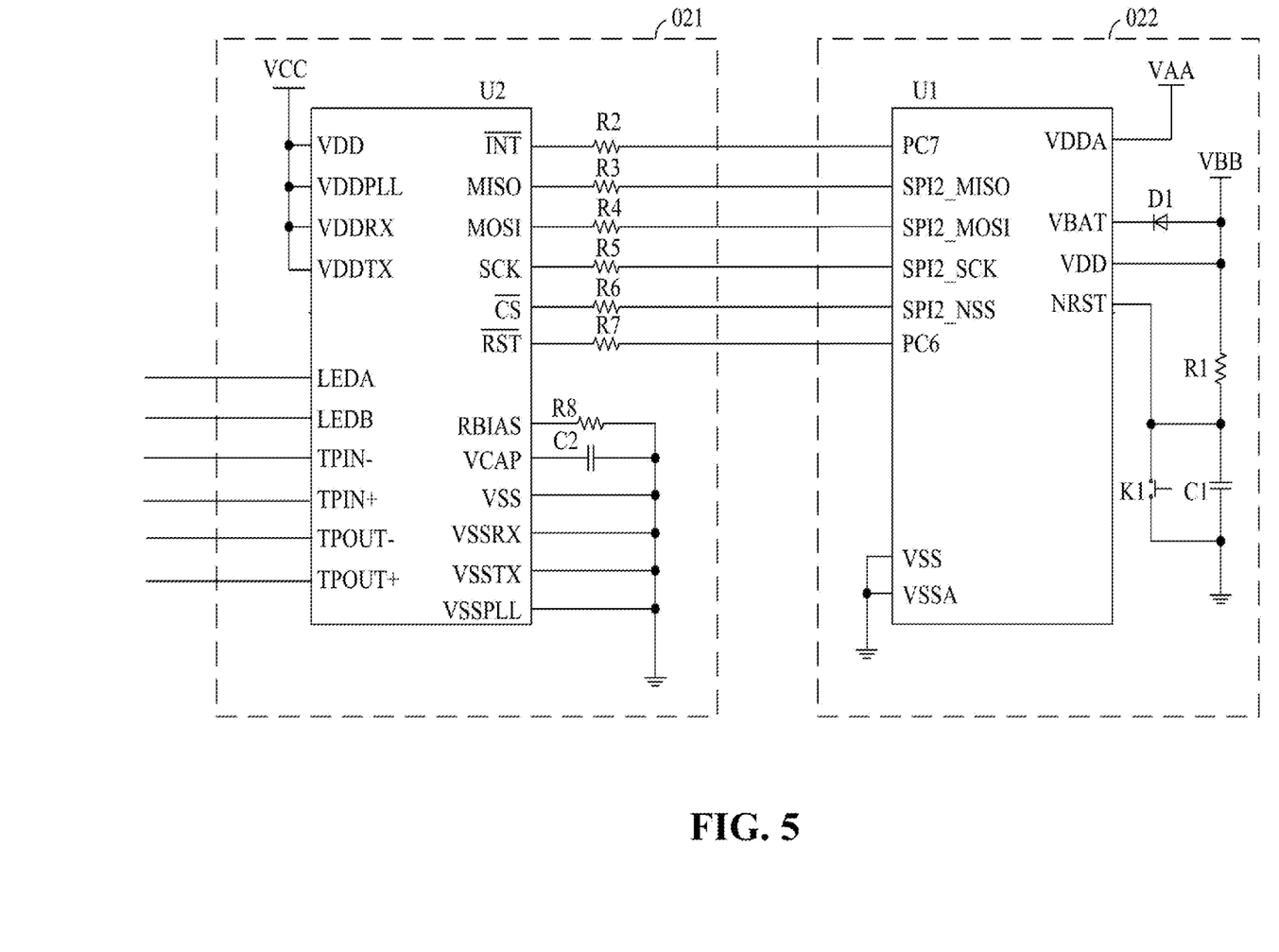
FIG. 5 is a diagram illustrating an Ethernet signal receiving module and a control module of an Ethernet controlling module according to an embodiment of the present invention.

FIG. 5 is a diagram illustrating the Ethernet signal receiving module 021 and the control module 022 of the Ethernet controlling module 02 according to an embodiment of the present invention. As shown in FIG. 5, the control module 022 comprises the microprocessor U1, a first diode D1, a first button K1, a first capacitor C1, and a first resistor R1.

According to the present embodiment, the first data input/output terminal PC7 of the microprocessor U1, the master out slave in (MOSI) terminal SPI2_MOSI of the microprocessor U1, the master in slave out (MISO) terminal SPI2_MISO of the microprocessor U1, the synchronous clock terminal SPI2_SCK of the microprocessor U1, the chip select (CS) terminal SPI2_NSS of the microprocessor U1, and the second data input/output terminal PC6 of the microprocessor U1 are configured to be the input terminal of the second serial signal of the control module 022. The analog supply power terminal VDDA of the microprocessor U1 is coupled to the first supply power VAA. The supply power terminal VBAT of the battery of the microprocessor U1 is coupled to the cathode of the first diode D1. The supply power terminal VDD of the microprocessor U1, the anode of the first diode D1, and the first terminal of the first resistor R1 are coupled to the second supply power VBB. The reset terminal NRST of the microprocessor U1 is coupled to the first terminal of the first button K1, the second terminal of the first resistor R1, and the first terminal of the first capacitor C1. The analog ground terminal VSSA of the microprocessor U1, the ground terminal VSS of the microprocessor U1, the second terminal of the first button K1, and the second terminal of the first capacitor C1 are coupled to the power ground. For brevity, the third data input/output terminal PA2, the fourth data input/output terminal PA1, and the fifth data input/output terminal PA3 of the microprocessor U1 are omitted in FIG. 5.

In addition, as shown in FIG. 5, the Ethernet signal receiving module 021 comprises an Ethernet controller U2, a second capacitor C2, a second resistor R2, a third resistor R3, a fourth resistor R4, a fifth resistor R5, a sixth resistor R6, a seventh resistor R7, and an eighth resistor R8.

The supply power terminal VDD of the Ethernet controller U2, the phase-locked loop supply power terminal VDDPLL of the Ethernet controller U2, the supply power receiving terminal VDDRX of the Ethernet controller U2, and supply power transmitting terminal VDDTX of the Ethernet controller U2 are coupled to the third supply power VCC.

The first LED driving terminal LEDA of the Ethernet controller U2, the second LED driving terminal LEDB of the Ethernet controller U2, the negative terminal TPIN− of the pair of differential input terminals of the Ethernet controller U2, the positive terminal TPIN+ of the pair of differential input terminals of the Ethernet controller U2, the negative terminal TPOUT− of the pair of differential output terminals of the Ethernet controller U2, and the positive terminal TPOUT+ of the pair of differential output terminals of the Ethernet controller U2 are configured to be the input terminals of the Ethernet signal receiving module 021 for receiving the Ethernet communication signal.

The interrupt signal output terminal INT of the Ethernet controller U2 is coupled to the first terminal of the second resistor R2. The master in slave out terminal MISO of the Ethernet controller U2 is coupled to the first terminal of the third resistor R3. The master out slave in terminal MOSI of the Ethernet controller U2 is coupled to the first terminal of the fourth resistor R4. The synchronous clock terminal SCK of the Ethernet controller U2 is coupled to the first terminal of the fifth resistor R5. The chip select terminal CS of the Ethernet controller U2 is coupled to the first terminal of the sixth resistor R6. The reset terminal RST of the Ethernet controller U2 is coupled to the first terminal of the seventh resistor R7. The second terminal of the second resistor R2, the second terminal of the third resistor R3, the second terminal of the fourth resistor R4, the second terminal of the fifth resistor R5, the second terminal of the sixth resistor R6, and the second terminal of the seventh resistor R7 are configured to be the output terminal of the second serial signal of the Ethernet signal receiving module. Therefore, the second terminal of the second resistor R2, the second terminal of the third resistor R3, the second terminal of the fourth resistor R4, the second terminal of the fifth resistor R5, the second terminal of the sixth resistor R6, and the second terminal of the seventh resistor R7 are coupled to the first data input/output terminal PC7, the master in slave out (MISO) terminal SPI2_MISO, the master out slave in (MOSI) terminal SPI2_MOSI, the synchronous clock terminal SPI2_SCK, the chip select (CS) terminal SPI2_NSS, and the second data input/output terminal PC6 of the microprocessor U1 respectively.

Moreover, the bias current terminal RBIAS of the Ethernet controller U2 is coupled to the first terminal of the eighth resistor R8. The external resistor terminal VCAP of the Ethernet controller U2 is coupled to the first terminal of the second capacitor C2. The ground terminal VSS of the Ethernet controller U2, the receiving ground terminal VSSRX of the Ethernet controller U2, the transmitting ground terminal VSSTX of the Ethernet controller U2, the phase-locked loop ground terminal VSSPLL of the Ethernet controller U2, the second terminal of the eighth resistor R8, and the second terminal of the second capacitor C2 are coupled to the power ground.

For brevity, merely a portion of schematic circuits of the microprocessor U1 are shown FIG. 4 and FIG. 5.

The operation of the schematic circuits in FIG. 4 and FIG. 5 is described in the following paragraphs.

According to some embodiments, the negative terminal TPIN− and the positive terminal TPIN+ of the pair of differential input terminals of the Ethernet controller U2 are arranged to receive the Ethernet communication signal. The Ethernet controller U2 is arranged to generate the second serial signal according to the Ethernet communication signal, and to output the second serial signal on the master out slave in terminal MOSI of the Ethernet controller U2. The master out slave in terminal SPI2_MOSI of the microprocessor U1 is arranged to receive the second serial signal. The microprocessor U1 is arranged to generate the first serial signal according to the second serial signal, wherein a set of first serial signal is outputted to the driving input terminal DI of the RS485 transceiver U3 via the fifth data input/output terminal PA3 of the microprocessor U1. The RS485 transceiver U3 is arranged to generate the serial bus signal according to the first serial signal, and the serial bus signal is outputted to the LED module(s) 001*i* via the positive driving output terminal A and the negative driving output terminal B of the RS485 transceiver U3.

Figure 6:
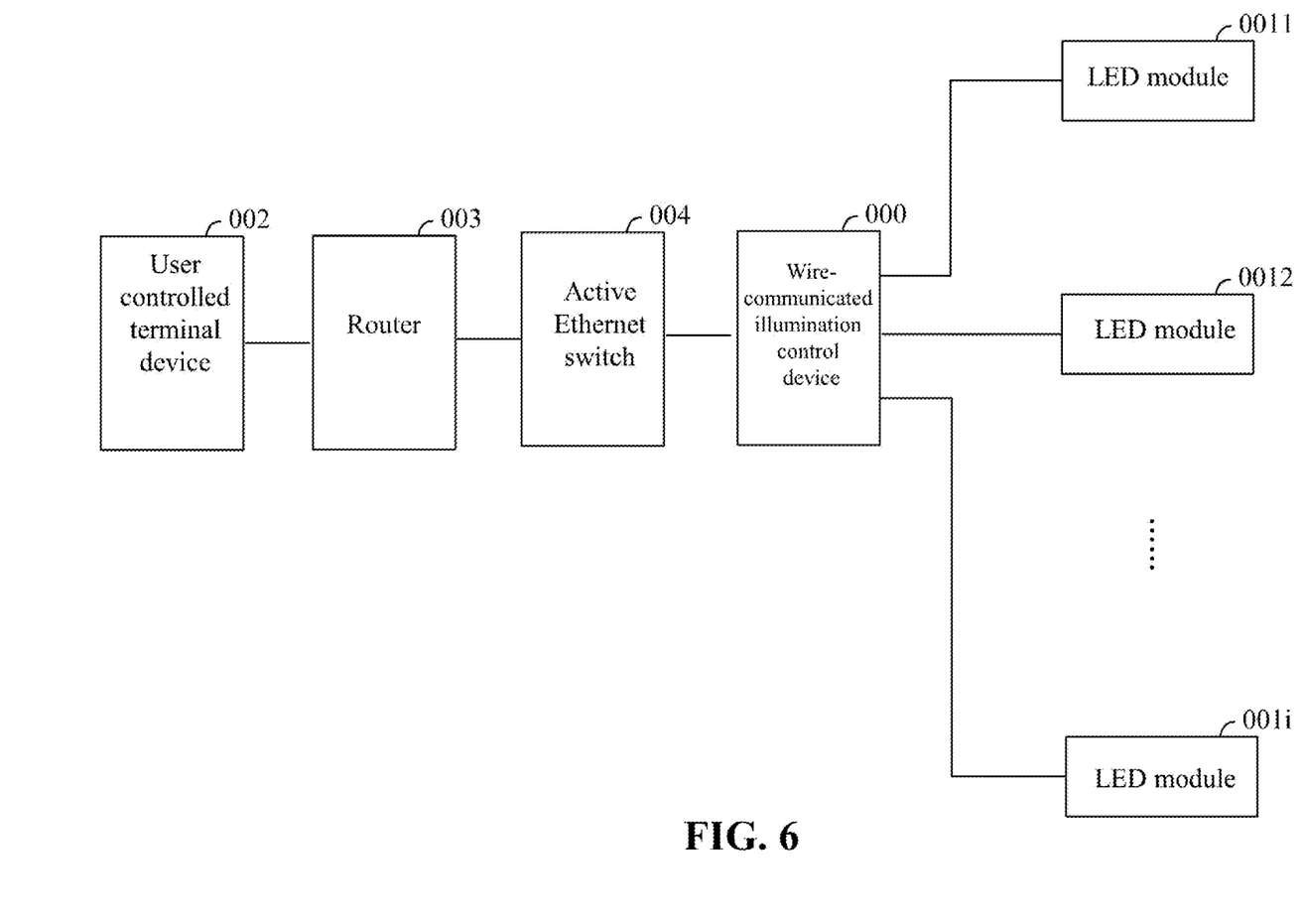
FIG. 6 is a diagram illustrating a wire-communicated illumination control system according to an embodiment of the present invention.

According to some embodiments, a wire-communicated illumination control system is provided in FIG. 6. FIG. 6 is a diagram illustrating a wire-communicated illumination control system according to an embodiment of the present invention. The wire-communicated illumination control system comprises a user controlled terminal device 002, a router 003, a plurality of LED modules 001*i*, an active Ethernet switch 004, and the above mentioned wire-communicated illumination control device 000. The active Ethernet switch 004 is coupled to the router 003 for outputting the Ethernet power and for forwarding the Ethernet communication signal to the wire-communicated illumination control device 000.

According to some embodiments, the user controlled terminal device 002 may be a terminal equipment. The terminal equipment may comprise mobile phone, computer, and tablet.

Figure 7:
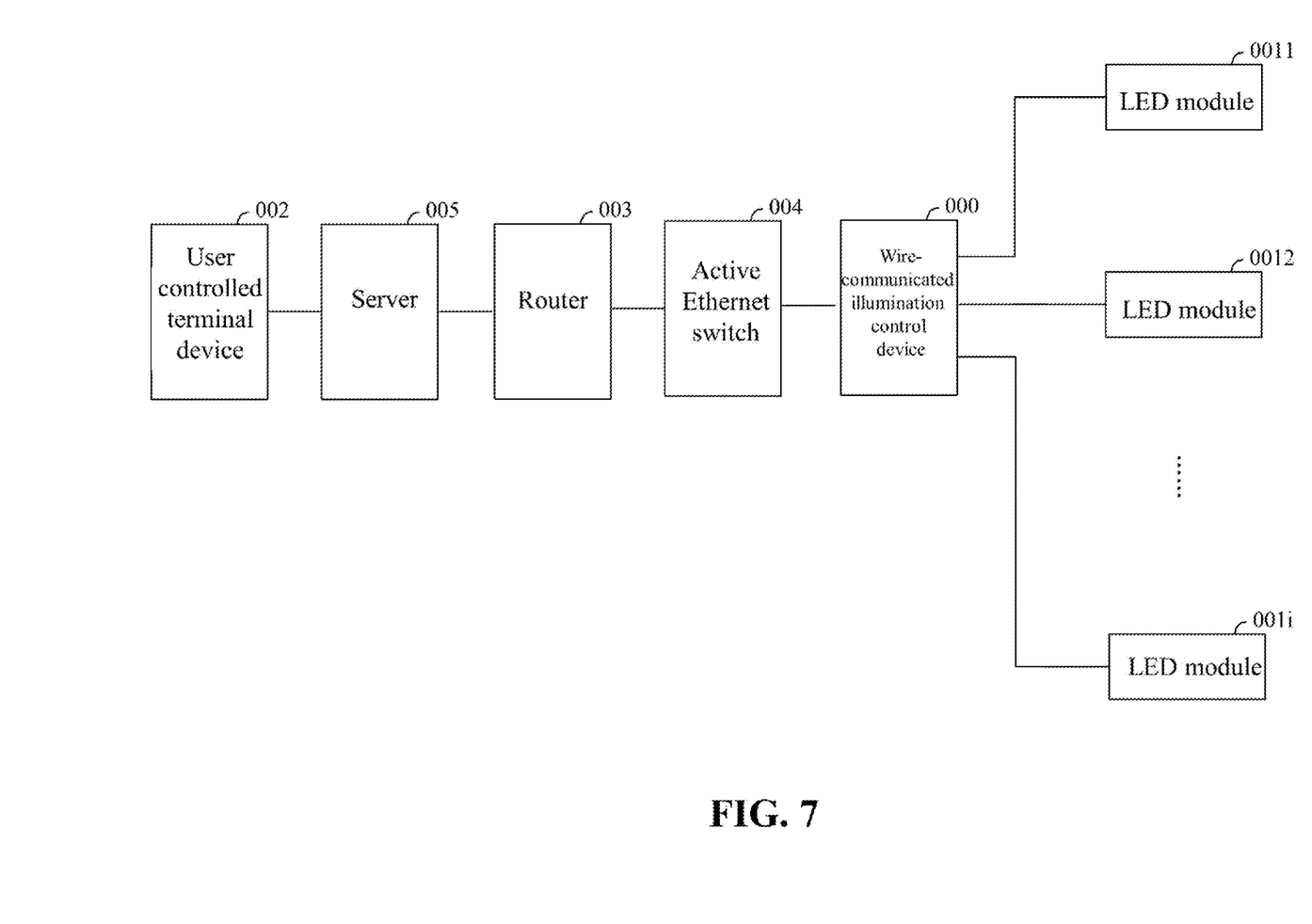
FIG. 7 is a diagram illustrating a wire-communicated illumination control system according to an embodiment of the present invention.

According to some embodiments, a wire-communicated illumination control system is provided in FIG. 7. FIG. 7 is a diagram illustrating a wire-communicated illumination control system according to an embodiment of the present invention. The wire-communicated illumination control system comprises a user controlled terminal device 002, a router 003, a plurality of LED modules 001*i*, an active Ethernet switch 004, a server 005, and the above mentioned wire-communicated illumination control device 000. In comparison to the wire-communicated illumination control system of FIG. 6, the wire-communicated illumination control system in FIG. 7 further comprise the server 005. The server 005 is coupled to the user controlled terminal device 002 and the router 003. The server 005 is arranged to generate the Ethernet communication signal according to the original Ethernet communication signal. The user controlled terminal device 002 is arranged to generate the original Ethernet communication signal according to a user inputted signal.

The original Ethernet communication signal is arranged to carry the illumination controlling commands. The server 005 is further arranged to output the information of the state of illumination according to the illumination controlling commands. Accordingly, the operation of the wire-communicated illumination control device 000 may be monitored by the server 005.

Figure 8:
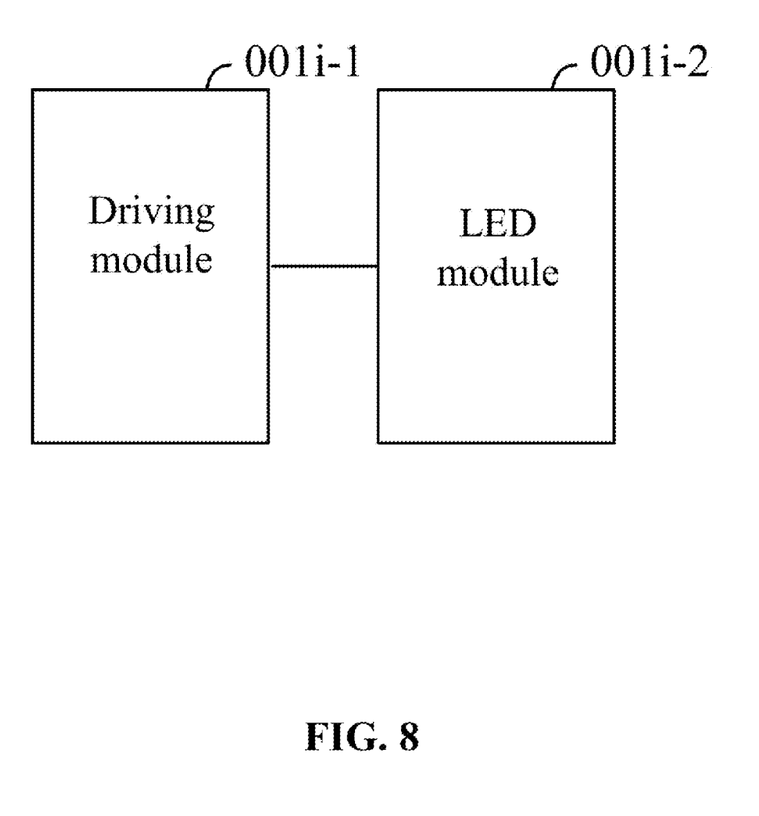
FIG. 8 is a diagram illustrating a LED module according to an embodiment of the present invention.

FIG. 8 is a diagram illustrating a LED module according to an embodiment of the present invention. The LED module may be one of the plurality of LED modules 001i. As shown in FIG. 8, the LED module comprises a driving module 001i-1 and an LED module 001i-2. The driving module 001i-1 is coupled to the LED module 001i-2 for controlling the LED module 001i-1.

The driving module 001i-1 arranged to generate the driving signal according to the serial bus signal. The LED module 001i-2 is coupled to the driving module 001i-1 for being illuminated according to the driving signal.

Briefly, according to some embodiments, the present control device, which is coupled to the LED modules, may comprise a power supply module, an Ethernet controlling module, and a serial communication module. The power supply module is arranged to generate the supply powers according to the Ethernet power, and the supply powers may be provided to various functional blocks. The Ethernet controlling module is arranged to generate the first serial signal according to the Ethernet communication signal. The serial communication module is coupled to the control module for generating the second serial signal according to the first serial signal. The plurality of LED modules are coupled to the serial communication module, and are being illuminated according to the serial bus signal. As the active Ethernet switch may output the Ethernet power, the power supply module may directly provide the supply powers to various functional blocks according to the Ethernet power. Accordingly, by using the present illumination control devices, the power adaptor, which generates supply power based on the AC (Alternative-current) power of the mains electricity, may be omitted. Therefore, the design complexity and the cost of the present illumination control device may be reduced.

In addition, terms such as "first" and "second" are used herein for purposes of description and are not intended to indicate or imply relative importance or significance or to imply the number of indicated technical features. Thus, the feature defined with "first" and "second" may include one or more of this feature. In the description of the present disclosure, "a plurality of" means two or more than two, unless specified otherwise.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A control device for controlling at least one LED module, comprising:
a power supply module, arranged to receive power over Ethernet to generate a first supply power; and
an illumination controlling module, coupled to the power supply module, for receiving a communication signal from the Ethernet to generate a serial bus signal to control an illumination of the at least one LED module;
wherein the illumination controlling module is powered by the first supply power,
wherein the illumination controlling module comprises:
an Ethernet controlling module, arranged to generate a first serial signal according to the Ethernet communication signal; and
a serial communication module, coupled to the Ethernet controlling module, for generating the serial bus signal according to the first serial signal;
wherein the first supply power comprises a second supply power and a third supply power, and the Ethernet controlling module and the serial communication module are powered by the second supply power and the third supply power respectively,
wherein the Ethernet controlling module comprises:
an Ethernet signal receiving module, arranged to generate a second serial signal according to the Ethernet communication signal; and
a control module, coupled to the Ethernet signal receiving module, for generating the first serial signal according to the second serial signal,
wherein the control module comprises:
a microprocessor, having a set of output terminals for outputting the first serial signal;
wherein the set of output terminals comprises three general purpose input/output terminals (GPIO) of the microprocessor,
wherein the second supply power comprises a fourth supply power and a fifth supply power, and the control module further comprises:
an analog supply power terminal for receiving the fifth supply power;
a first diode, having a cathode coupled to a supply power terminal of a battery of the microprocessor, and an anode coupled to the fourth supply power;

a first button, having a first terminal coupled to a reset terminal of the microprocessor, and a second terminal coupled to a power ground;

a first capacitor, having a first terminal coupled to the reset terminal of the microprocessor, and a second terminal coupled to the power ground; and a first resistor, having a first terminal coupled to the fifth supply power and a supply power terminal of the microprocessor, and a second terminal coupled to the reset terminal of the microprocessor.

2. The control device of claim 1, wherein the power supply module comprises:

a power converting module, arranged to convert the Ethernet power into a current; and a buck converter, coupled to the power converting module, the Ethernet controlling module, and the serial communication module, for generating the second supply power and the third supply power according to the current.

3. The control device of claim 1, wherein the microprocessor further comprises a first data input/output terminal, a master out slave in (MOSI) terminal, a master in slave out (MISO) terminal, a synchronous clock terminal, a chip select (CS) terminal, and a second data input/output terminal for receiving the second serial signal.

4. The control device of claim 3, wherein the Ethernet signal receiving module comprises:

an Ethernet controller, having an interrupt signal output terminal, a master in slave out terminal, a master out slave in terminal, a synchronous clock terminal, a chip select terminal, a reset terminal, a bias current terminal, and an external resistor terminal;

a second capacitor, having a first terminal coupled to the external resistor terminal, and a second terminal coupled to the power ground;

a second resistor, having a first terminal coupled to the interrupt signal output terminal, and a second terminal coupled to the first data input/output terminal of the microprocessor;

a third resistor, having a first terminal coupled to the master in slave out terminal of the Ethernet controller, and a second terminal coupled to the master in slave out terminal of the microprocessor;

a fourth resistor, having a first terminal coupled to the master out slave in terminal of the Ethernet controller, and a second terminal coupled to the master out slave in terminal of the microprocessor;

a fifth resistor, having a first terminal coupled to the synchronous clock terminal of the Ethernet controller, and a second terminal coupled to the synchronous clock terminal of the microprocessor;

a sixth resistor, having a first terminal coupled to the chip select terminal of the Ethernet controller, and a second terminal coupled to the chip select terminal of the microprocessor;

a seventh resistor, having a first terminal coupled to the reset terminal of the Ethernet controller, and a second terminal coupled to the second data input/output terminal of the microprocessor; and an eighth resistor, having a first terminal coupled to the bias current terminal of the Ethernet controller, and a second terminal coupled to the power ground.

5. The control device of claim 4, wherein the second supply power further comprises a sixth supply power, the Ethernet controller further comprises a supply power terminal, a phase-locked loop supply power terminal, a supply power receiving terminal, and a supply power transmitting terminal, and the supply power terminal, the phase-locked loop supply power terminal, the supply power receiving terminal, and the supply power transmitting terminal are coupled to the sixth supply power.

6. The control device of claim 4, wherein the Ethernet controller further comprises a first LED driving terminal, a second LED driving terminal, a negative terminal of a pair of differential input terminals, a positive terminal of the pair of differential input terminals, a negative terminal of a pair of differential output terminals, and a positive terminal of the pair of differential output terminals, for receiving the Ethernet communication signal.

7. The illumination control system of claim 1, wherein the serial communication module comprises:

a transceiver, having a receiving output terminal, a receiving enable terminal, a driving enable terminal, and a driving input terminal;

a ninth resistor, having a first terminal coupled to the receiving output terminal;

a tenth resistor, having a first terminal coupled to the receiving enable terminal and the driving enable terminal;

an eleventh resistor, having a first terminal coupled to the driving input terminal;

wherein a second terminal of the ninth resistor, a second terminal of the tenth resistor, and a second terminal of the eleventh resistor are arranged to receive the first serial signal.

8. The illumination control system of claim 7, wherein the transceiver further comprises a supply power terminal, a positive driving output terminal, a negative driving output terminal, and a ground terminal, and the serial communication module further comprises:

a second capacitor, having a first terminal coupled to the supply power terminal of the transceiver and the third supply power, and a second terminal coupled to the power ground;

a twelfth resistor, having a first terminal coupled to the supply power terminal of the transceiver, and a second terminal coupled to the positive driving output terminal of the transceiver;

a thirteenth resistor, having a first terminal coupled to the second terminal of the twelfth resistor;

a fourteenth resistor, having a first terminal coupled to the ground terminal of the transceiver, and a second terminal coupled to the negative driving output terminal of the transceiver;

a fifteenth resistor, having a first terminal coupled to the second terminal of the fourteenth resistor;

a sixteenth resistor, having a first terminal coupled to a second terminal of the thirteenth resistor, and a second terminal coupled to a second terminal of the fifteenth resistor;

a first Zener diode, having a cathode coupled to the second terminal of the twelfth resistor, and an anode coupled to the power ground;

a second Zener diode, having a cathode coupled to the second terminal of the fourteenth resistor, and an anode coupled to the power ground; and a third Zener diode, having a cathode coupled to the second terminal of the twelfth resistor, and an anode coupled to the second terminal of the fourteenth resistor;

wherein the second terminal of the thirteenth resistor, the second terminal of the fifteenth resistor, the first terminal and the second terminal of the sixteenth resistor are configured to be a plurality of output terminals for outputting the serial bus signal of the serial communication module.

\* \* \* \* \*